(12) United States Patent
Cushen et al.

(10) Patent No.: US 12,096,595 B2
(45) Date of Patent: Sep. 17, 2024

(54) COLD PLATE AND SYSTEM FOR COOLING ELECTRONIC DEVICES

(71) Applicant: ICEOTOPE GROUP LIMITED, Rotherham (GB)

(72) Inventors: Alexander Cushen, Rotherham (GB); Neil Edmunds, Rotherham (GB); David Amos, Sheffield (GB)

(73) Assignee: Iceotope Group Limited, South Yorkshire (GB)

( * ) Notice: Subject to any disclaimer, the term of this patent is extended or adjusted under 35 U.S.C. 154(b) by 246 days.

(21) Appl. No.: 17/777,243

(22) PCT Filed: Nov. 18, 2020

(86) PCT No.: PCT/GB2020/052929
§ 371 (c)(1),
(2) Date: May 16, 2022

(87) PCT Pub. No.: WO2021/099768
PCT Pub. Date: May 27, 2021

(65) Prior Publication Data
US 2022/0418156 A1 Dec. 29, 2022

(30) Foreign Application Priority Data

Nov. 18, 2019 (GB) ..................... 1916768

(51) Int. Cl.
*H05K 7/20* (2006.01)
(52) U.S. Cl.
CPC ..... *H05K 7/20254* (2013.01); *H05K 7/20272* (2013.01); *H05K 7/20509* (2013.01)

(58) Field of Classification Search
CPC .......... H05K 7/20254; H05K 7/20272; H05K 7/20509; H05K 7/20236
See application file for complete search history.

(56) References Cited

U.S. PATENT DOCUMENTS 11,917,796 B2 * 2/2024 Longhurst .......... H05K 7/20236
2010/0103620 A1 4/2010 Campbell
(Continued)

FOREIGN PATENT DOCUMENTS

| CN | 2013120357 | 8/2013 |
|---|---|---|
| GB | 2570622 | 8/2019 |

(Continued)

OTHER PUBLICATIONS

International Search Report and Written Opinion issued in App. No. PCT/GB2020/052929, mailing date Feb. 3, 2021, 15 pages.

*Primary Examiner* — Marc E Norman
(74) *Attorney, Agent, or Firm* — Butzel Long

(57) ABSTRACT

A cold plate is configured to use isolated primary and secondary liquid coolants and comprises: a thermally conductive body defining an internal volume and arranged for mounting with respect to an electronic device, so as to transfer heat from the electronic device to the internal volume; a coolant inlet for receiving the secondary liquid coolant into the internal volume to receive the transferred heat; and a coolant outlet for the secondary liquid coolant to flow out of the internal volume. The thermally conductive body is configured to define an external receptacle having a volume arranged to receive and retain the primary liquid coolant for heat transfer between the primary and secondary liquid coolants. The cold plate may form part of a system for cooling electronic devices.

20 Claims, 9 Drawing Sheets

(56) References Cited

U.S. PATENT DOCUMENTS

| | | | |
|---|---|---|---|
| 2016/0216048 A1 | 7/2016 | Tsai | |
| 2017/0043437 A1 | 2/2017 | Boday | |
| 2018/0027695 A1 | 1/2018 | Wakino | |
| 2020/0227341 A1* | 7/2020 | Neal | F28F 3/12 |
| 2022/0201896 A1* | 6/2022 | Edmunds | H05K 7/20263 |
| 2022/0369517 A1* | 11/2022 | Gao | H05K 7/2029 |
| 2024/0032243 A1* | 1/2024 | Matteson | H05K 7/20263 |

FOREIGN PATENT DOCUMENTS

| | | |
|---|---|---|
| JP | H05251600 | 9/1993 |
| JP | 2011518395 A | 6/2011 |

* cited by examiner

COLD PLATE AND SYSTEM FOR COOLING ELECTRONIC DEVICES

TECHNICAL FIELD OF THE DISCLOSURE

The disclosure concerns a cold plate and a system for cooling electronic devices comprising such a cold plate.

BACKGROUND TO THE INVENTION

Computers, servers, and other devices used for data processing (referred to as Information Technology or IT) typically comprise printed circuit boards (PCBs). On these PCBs are small devices called Integrated Circuits (IC), which may include central processing units (CPUs), Application Specific Integrated Circuits (ASICs), Graphical Processing Units (GPUs), Random-Access Memory (RAM), etc. All of these electronic components or devices generate heat when in use. In order to maximise the performance of the IT, heat should be transferred away, in order to maintain the contents at an optimal temperature. These considerations also apply to other types of electronic devices or systems.

IT is usually housed within a case, enclosure or housing. In a server for instance, this enclosure is sometimes referred to as the server chassis. A server chassis typically adheres to a number of industry standards that specify the height of each chassis, referred to as 1RU (one rack unit) or 1OU (one open unit), these are also abbreviated to 1U or 1OU. The smaller of the 2 main standards is the 1RU/1U, which is 44.45 mm or 1.75 inches in height. Such units are sometimes referred to as a "blade" server in the sense of shape and style, although it may not be necessary for such a server chassis to slot or plug into a backplane, for example.

Different server products can utilise more than one RU/OU at a time for the chassis, for example a 2U chassis uses 2 rack units. The size of each server chassis is usually kept to a minimum to maximise the amount of computing power per server rack (a server rack is the main housing that server chassis are added to).

Typically, the electronic components or devices that are used on or in IT are cooled using air. This usually includes a heatsink of some kind with fins or similar being placed in contact with the chip surface either directly, or with a TIM (thermal interface material) between the two components. In addition to the heat sink, each enclosure uses a series of fans to pull air through the enclosure, removing heat from the heatsink and expelling it from the chassis. This type of heat sink is used in combination with cooling at the server facility side, such as air conditioning. This method of cooling is not especially efficient, has a high running cost, and uses large amounts of space for managing the air used for cooling.

This method of cooling IT has been used almost exclusively for mass-manufactured IT and server equipment. However, in more recent times, the peak performance of the heat generating chips has been throttled due to the limitations of cooling a device with air. As technology halves in size for the same performance every couple of years (as exemplified in Moore's law), the heat produced by chips is increasing as the footprint of the component decreases. This has seen an increase in the size and complexity of heatsinks designed for air cooling. As a result, there is often an increase in the required server chassis size, thus decreasing the computing power within a single rack.

As an alternative to air cooling, liquid cooling can be used. Liquid cooling can in some cases provide a more efficient heat transfer from the electronic components or devices, and so greater cooling power. These liquids include dielectric fluids, mineral oil and water to mention a few. A number of existing approaches using liquid cooling are known. For example, International Patent Publication No. 2018/096362, commonly assigned with the present disclosure, describes an immersive liquid cooling approach in which a primary liquid coolant, typically a dielectric liquid, is pumped within a sealed chassis, such that the primary liquid coolant stays inside. A heat exchanger is also within the chassis and transfers heat from the primary liquid coolant to a secondary liquid coolant which flows outside the chassis (and may be shared between multiple chassis) and is typically water or water-based (advantageous as having a high specific heat capacity).

Building on this, International Patent Publication No. 2019/048864, also commonly assigned with the present disclosure, describes a number of types of heat sink that may be mounted on, around or adjacent to an electronic device or an electronic device may be mounted on or around the heatsink. The heat sinks define an internal volume for accumulating and retaining primary liquid coolant adjacent to the electronic device (or devices). As the primary liquid coolant flows (by pumping and/or by convection) within the chassis, it is directed to the internal volumes of the heat sinks, causing improved cooling of the electronic devices (for example, ICs getting particularly hot in operation or power supply units). Primary liquid coolant then flows out of the heat sink internal volume (for example, by overflowing and/or by flowing through holes in the volume) and collects with the remaining primary liquid coolant in the chassis, in order to cool other electronic devices (for example, other components or ICs on a PCB or mounted in other ways in the chassis). The primary liquid coolant is again cooled by a heat exchanger in the chassis and heat is transferred to a secondary liquid coolant. In this approach, the level of primary liquid coolant in the chassis can be kept low and certainly lower than the level of primary liquid coolant in the heat sink internal volume. This forms liquid cooling at multiple levels (heights), reducing the quantity of liquid coolant needed and allowing efficient single-phase (that is, liquid-phase only) cooling of the electronic devices. Since the primary liquid coolant can be expensive, difficult to contain and prone to contamination, this approach can provide significant benefits in terms of reduced cost and complexity.

In a different approach, U.S. Pat. No. 7,724,524 describes a hybrid immersion cooling apparatus for computing systems, in which a chassis of a blade server houses electronic components. Cold plates are coupled to certain of the electronic components for cooling and pipes within the chassis provide coolant to the cold plates from outside the chassis. After passing through the cold plate (or through multiple cold plates), the coolant is returned to outside the chassis. Another coolant is provided in the chassis and submerges the remaining electronic components and cold plates. The chassis is liquid-sealed to prevent escape of this coolant. The submerging coolant is cooled by the coolant flowing through the cold plates. Making the server environment quieter and more energy efficient are identified as key considerations in this document.

It would be desirable to provide an improved liquid coolant-based system with high performance and efficiency.

SUMMARY OF THE DISCLOSURE

Against this background, there is provided a cold plate in accordance with claim 1 and a system for cooling electronic devices as defined in claim 8. Further preferable and/or advantageous features are identified in the dependent claims and in the remaining disclosure herein. A method of manufacturing and/or operating a cold plate and/or a system for cooling electronic devices having steps corresponding with the structural features described herein may also be considered.

A cold plate having an external receptacle is provided. The external receptacle defines a volume that can receive (for example, through a nozzle) and accumulate and/or retain a primary liquid coolant so to provide heat transfer between the primary liquid coolant on the outside of the cold plate and a secondary liquid coolant flowing through the cold plate (for example, in a conventional way). The primary and secondary liquid coolants are advantageously distinct, separate and physically isolated from one another (although thermally coupled). Such an approach may be significantly more efficient than those previously described, increasing the The primary liquid coolant may be a dielectric and/or the secondary liquid coolant may be water-based. The body of the cold plate is thermally conductive to allow heat transfer from an electronic device on or adjacent to which the cold plate is mounted to the secondary liquid coolant. The secondary liquid coolant typically flows through a liquid circuit entirely distinct from the primary liquid coolant. The external receptacle volume may be defined by a retaining wall formed by or integral with the body of the cold plate, further promoting heat transfer. The volume is generally closed, typically except for being open on one side. The open side may be parallel (for instance, opposite) the mounting surface of the cold plate (typically planar) and such an embodiment may be suitable for horizontal mounting. Alternatively, the open side may be perpendicular (for instance, adjacent) the mounting surface of the cold plate, which may be suitable for vertical mounting.

Projections (pins and/or fins) may be formed in the volume of the external receptacle. This may promote heat transfer between the primary and secondary liquid coolants. Additionally or alternatively, projections (pins and/or fins) may be formed within the cold plate. These may more generally promote heat transfer, especially wherein the projections extend entirely (or at least substantially) between the inner surface of the cold plate that sits adjacent the electronic device being cooled and the opposite inner surface of the cold plate (which is generally adjacent the volume of the external receptacle).

The cold plate generally forms part of a system that also includes a chassis housing electronic devices, the cold plate mounted on or adjacent to one of the electronic devices to cool it and the primary liquid coolant. The primary liquid coolant flows (for example, by pumping and/or convection) and is directed into the volume of the external receptacle of the cold plate via a suitable nozzle. The primary liquid coolant may thus be cooled by contact with the cold plate, specifically its external receptacle. Multiple such cold plates may be provided, each cooling a different electronic device (or devices) and these may be connected in series and/or parallel, as will be discussed below.

Beneficially, the primary liquid coolant flows out of the volume of the external receptacle (for example, by overflowing) and then at least partially immerses other electronic devices in the chassis. A level of primary liquid coolant in the chassis outside the heat sink is lower than a level held in the volume of the external receptacle. This creates multiple levels of primary liquid coolant, reducing the quantity of primary liquid coolant needed without reducing the efficiency of heat transfer. In particular, the system may be configured such that all primary liquid coolant flows through the volume of the external receptacle of one or more cold plates.

The chassis advantageously comprises a respective inlet and outlet for secondary liquid coolant to and from outside the chassis (for example, using quick disconnect connectors). Piping may then be provided to transfer the cool secondary liquid coolant from the inlet to the cold plate and to transfer the warmed secondary liquid coolant from the cold plate to the outlet. An inlet manifold may be provided between the inlet and piping and/or an outlet manifold may be provided between the piping and outlet. The manifolds may be useful in coupling multiple cold plates to the same inlet and outlet in parallel. Additionally or alternatively, cold plates may be coupled in series. Where multiple cold plates are provided, one, some or all of the cold plates may be in accordance with the cold plate design disclosed herein.

The primary liquid coolant may flow by convection and/or by pumping. Where a pump is used, a pump manifold may be provided to couple a single pump to multiple cold plates. More than one pump may be used in embodiments. For example, each pump may form part of a respective cold plate. This may be in the form of a micro-pump, for instance.

BRIEF DESCRIPTION OF THE DRAWINGS

The disclosure may be put into practice in a number of ways and preferred embodiments will now be described by way of example only and with reference to the accompanying drawings, in which.

DETAILED DESCRIPTION OF PREFERRED EMBODIMENTS

Figure 1:
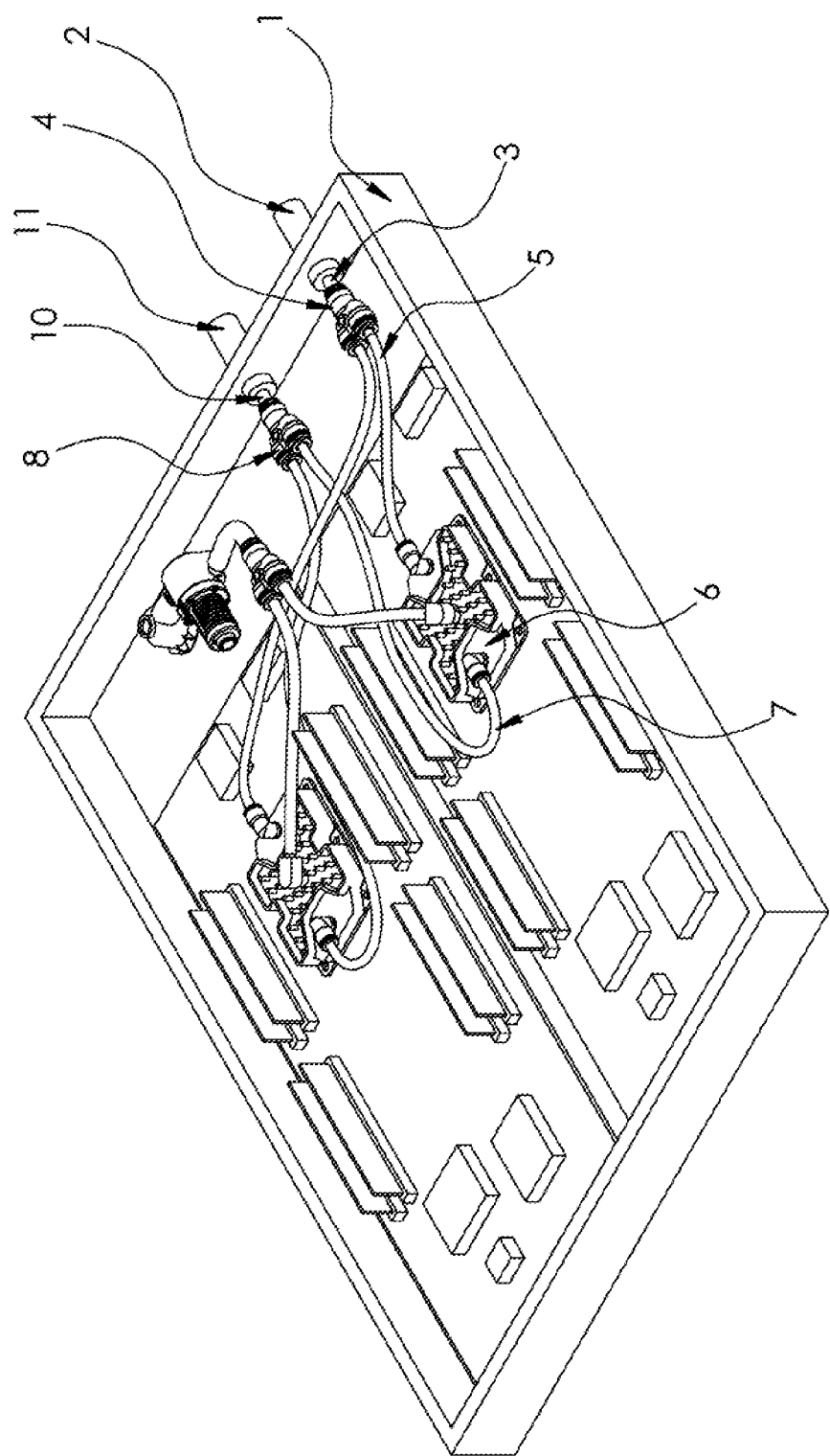
FIG. 1 shows a schematic isometric view of an interior of a server chassis in accordance with an embodiment of the disclosure.

The disclosure generally provides a hybrid cold plate and heat sink component for use in a multi-stage (single-phase) liquid cooling system, particularly for use in cooling computer server blades, but the skilled person will recognise the applicability of the technology to cooling other electronic components and devices. The primary liquid coolant circulates within a server chassis (typically by pumping, although convection may be used in addition or instead). The general level of primary liquid coolant in the chassis is used to cool lower temperature components within the chassis. Hotter components are cooled by a cold plate that is thermally coupled to the component (in particular, mounted on the cold plate). The cold plate receives a secondary liquid coolant from outside the chassis. The primary and secondary liquid coolants are isolated from one another, in the sense that they are distinct, different (in particular, the primary liquid coolant is typically not electrically conductive, whereas the secondary liquid coolant is generally water-based) and do not come into direct contact with one another. However, the primary liquid coolant is pumped directly onto the cold plate and retained against the thermally conductive body of the cold plate in a vessel-shaped (receptacle) part of the cold plate. This holding of the primary liquid coolant against the cold plate body allows heat transfer between the primary and secondary liquid coolants.

In this way, the cold plate of the present disclosure may represent a hybrid of a cold plate (using a water-based coolant) and a heat sink of the type disclosed in International Patent Publication No. 2019/048864 (using a dielectric coolant). The cold plate technology provides high performance cooling and focusses on cooling the hottest components. However, the approach taken by the present disclosure avoids the need for a cold plate to be directly mounted on each component. The cold plate cools the hottest components (for example processors or Graphical Processing Units, GPUs), while the rest of the components are cooled using the dielectric coolant.

In a generalised first aspect, a cold plate may be considered. The cold plate is configured to use isolated (in other words, distinct, separate or non-mixed) primary and secondary liquid coolants. The cold plate comprises: a thermally conductive body defining an internal volume (for receiving the secondary liquid coolant) and arranged for mounting with respect to an electronic device (for example, by means of one of more of: shaping and/or dimensioning of the body; and provision of mounting points and/or holes), so as to transfer heat from the electronic device to the internal volume (via the body); a coolant inlet for receiving the secondary liquid coolant into the internal volume to receive the transferred heat; and a coolant outlet for the secondary liquid coolant to flow out of the internal volume. The thermally conductive body is further configured (for example, shaped or arranged) to define an external receptacle (that is, a receptacle that is outside the cold plate body or housing, contrasting with the internal volume within the body). The external receptacle has a volume and is arranged to receive and retain the primary liquid coolant for heat transfer between the primary and secondary liquid coolants. In particular, the volume of the external receptacle is substantially closed (for example, except for relatively small holes) on all but one side.

Such arrangements have significant advantages compared with existing approaches. The cold plate heat sink hybrid device of such a design provides an efficient primary (for example, dielectric) liquid coolant loop, in which heat is transferred from the flowing primary liquid coolant to the secondary (for example, water-based or essentially comprising water) liquid coolant in an efficient way. There are resulting benefits in pressure, space and power, as will be further discussed below. Further optional and/or preferable features will be discussed in a more generalised sense below, but further details of a specific embodiment will initially be presented.

Referring first to FIG. 1, there is shown a schematic isometric view of an interior of a server chassis 1 in accordance with an embodiment of the disclosure. In this drawing, the water-based (secondary) coolant loop is particularly shown. This comprises: an inlet quick-disconnect connector 2; an inlet hose 3; an inlet manifold 4; inlet piping hoses 5; cold plate heat sink hybrid devices 6; outlet piping hoses 7; an outlet manifold 8; an outlet hose 10; and an outlet quick-disconnect connector 11. Other features forming part of this embodiment are discussed with respect to FIG. 2 below.

The secondary coolant enters the liquid-tight chassis housing 1 through the inlet quick-disconnect connector 2 on the back of the chassis 1. The coolant then passes through the inlet hose 3 and is split via the inlet manifold 4 (in this case, in two ways, but it will be appreciated that it could be more) over two paths defined by respective inlet piping hoses 5, each directing the secondary liquid coolant into a respective cold plate heat sink hybrid device 6. The secondary liquid coolant passes though each cold plate heat sink hybrid device 6, cooling the electronic components on which the device 6 are mounted. These are relatively hot electronic components, but are not visible in this drawing (due to the cold plate heat sink hybrid device 6). After passing through the cold plate heat sink hybrid device 6, the secondary liquid coolant (which is still in liquid form, as this is a single-phase system) then flows through the outlet piping hoses 7, into the outlet manifold 8, through the outlet hose 10 and the outlet quick disconnect 11.

Figure 2:
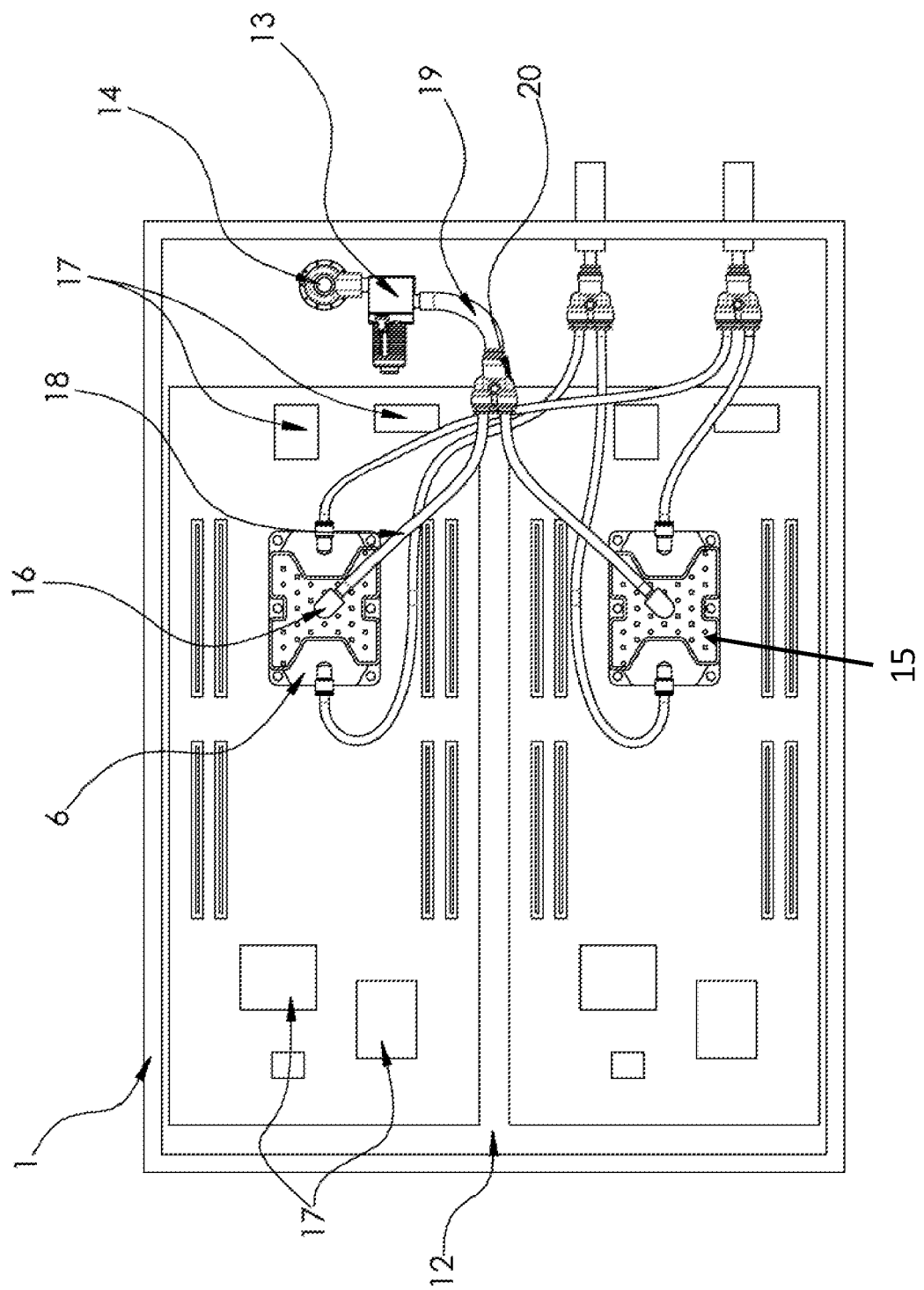
FIG. 2 depicts a schematic plan view of the interior of a server chassis shown in FIG. 1.

Referring next to FIG. 2, there is depicted a schematic plan view of the interior of a server chassis 1 shown in FIG. 1. Where the same features are depicted as in FIG. 1, identical reference numerals are used. This more particularly shows the primary (dielectric) liquid coolant loop. In this respect, the embodiment further comprises: a base 12; a pump 13; pump inlet nozzle 14; outlet nozzles 16; relatively low temperature components 17; primary coolant pipes 18; a pump outlet hose 19; and a pump outlet manifold 20. More detail about the cold plate heat sink hybrid device 6 is also more visible, in that the device 6 comprises a receptacle part, which defines a volume on the outside of the cold plate heat sink hybrid device 15. The dielectric coolant generally sits in the base 12 of the liquid-tight chassis 1. The pump 13 picks up the hot liquid dielectric coolant through the pump inlet nozzle 14. The primary liquid coolant goes through a pump outlet hose 19 to the pump outlet manifold 20 and through coolant pipes 18 into the receptacle part 15 of the cold plate heat sink hybrid device 6 via the outlet nozzles 16. The primary liquid coolant is then cooled by the secondary liquid coolant running through the cold plate part of the cold plate heat sink hybrid device 6. The primary liquid coolant accumulates in and overflows the receptacle part 15. The overflowing primary liquid coolant then collects with the other primary liquid coolant and cools all other lower temperature components 17, before or as it returns to the pump inlet nozzle 14.

Typically, the level of primary liquid coolant in the base 12 is lower than the level of primary liquid coolant held in the receptacle part 15 of the cold plate heat sink hybrid device 6. In this way, neither the lower temperature components 17 nor the cold plate heat sink hybrid devices are submerged by the primary liquid coolant. However, the lower temperature components 17 are at least partially immersed in the primary liquid coolant, so that the primary liquid coolant receives at least some of their generated heat.

Figure 3:
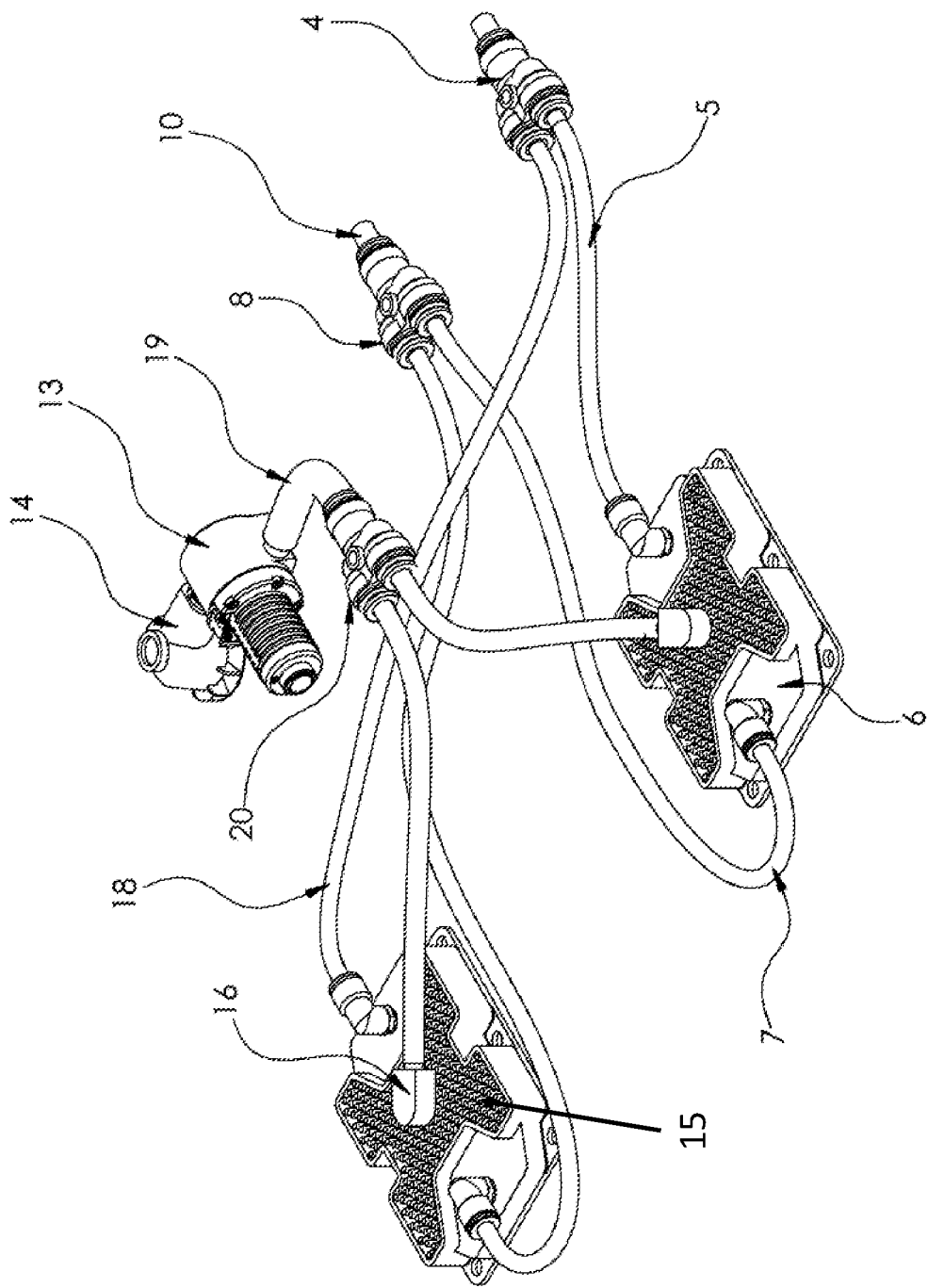
FIG. 3 illustrates a schematic isolated isometric view of a portion of the components within the server chassis shown in FIG. 1.

With reference to FIG. 3, there is illustrated a schematic isolated isometric view of a portion of the components within the server chassis shown in FIGS. 1 and 2. This portion relates to the primary liquid coolant loop (or circuit), as discussed above, although the flow from the receptacle part 15 of the cold plate heat sink hybrid device 6 to the base 12 of the chassis 1 is not shown in this drawing. The same reference numerals are used to label identical features to those shown in previous drawings.

An important aspect of the cold plate heat sink hybrid device 6 is that the primary liquid coolant (and typically all of the primary liquid coolant) is cooled by the secondary liquid coolant loop, specifically by the primary liquid coolant being pumped onto and held against the cold plate in the special receptacle part. The secondary liquid (water-based) coolant flowing within the cold plate heat sink hybrid device 6 is cooler than the heated primary (dielectric) liquid coolant. This will be described further below.

Figure 4:
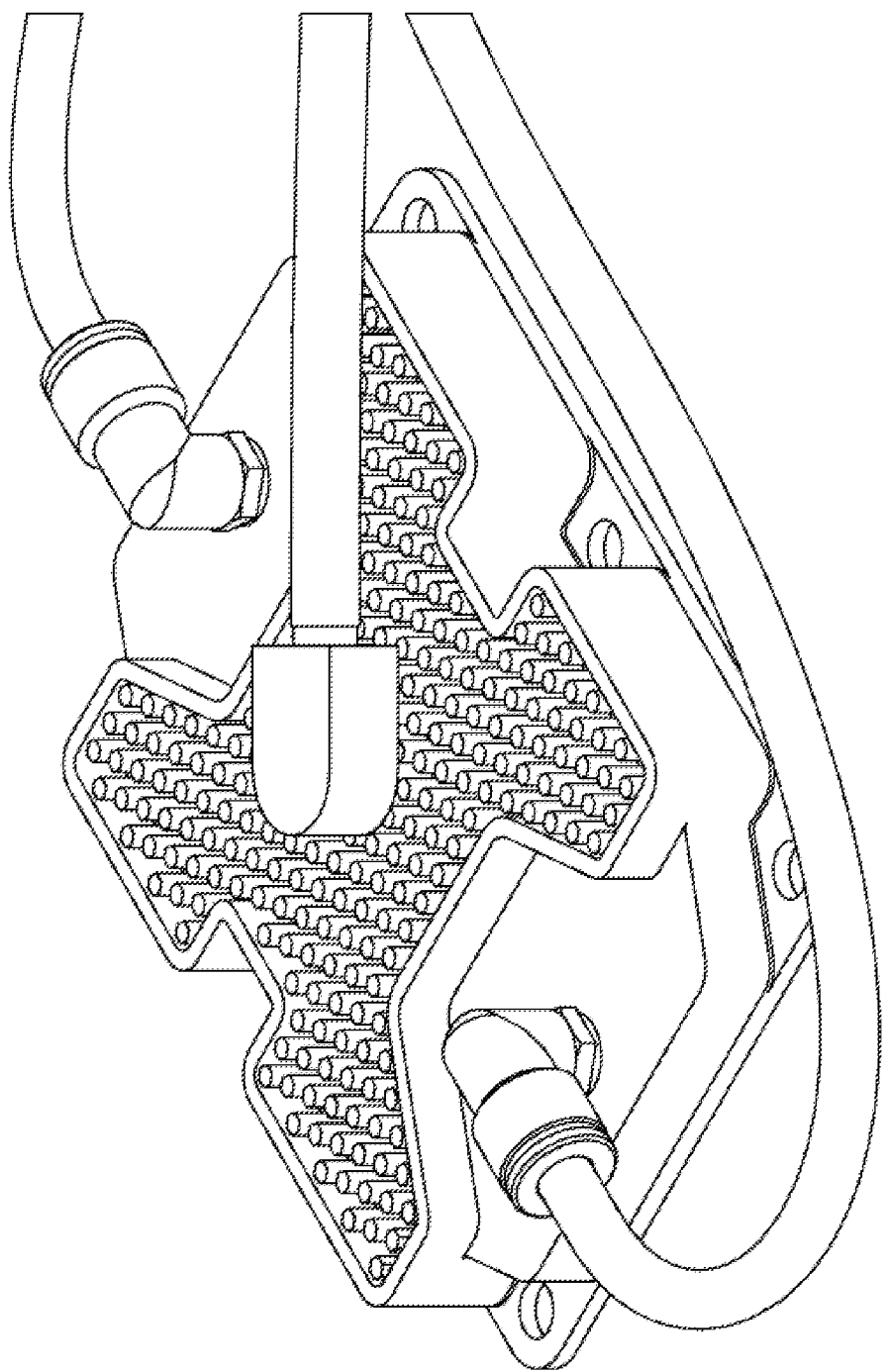
FIG. 4 schematically depicts an isometric view of a cold plate in accordance with an embodiment of the disclosure, for use in the server chassis shown in FIG. 1.
Figure 5:
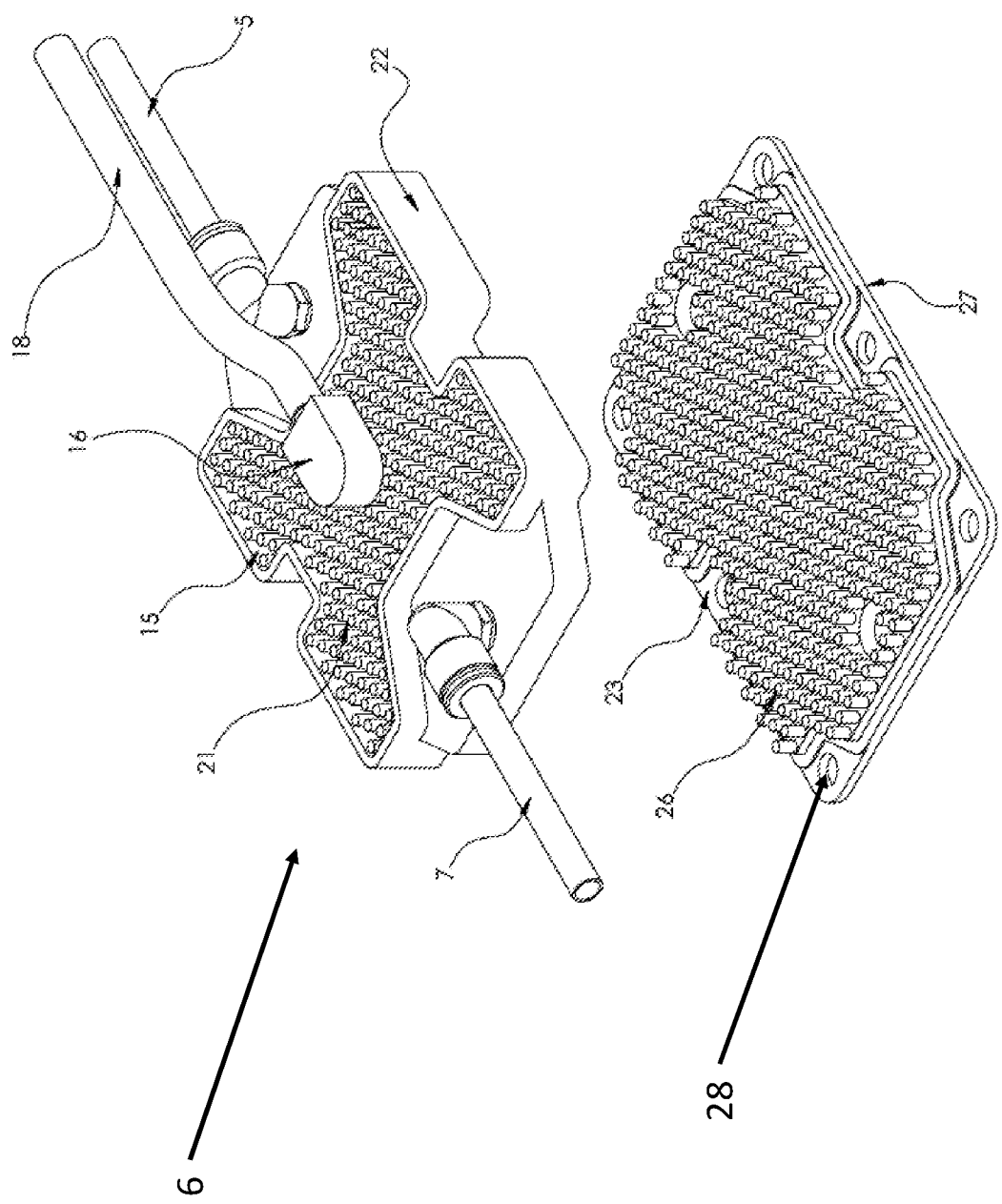
FIG. 5 shows an exploded view of the cold plate of FIG. 4.

Referring next to FIG. 4, there is schematically depicted an isometric view of a cold plate heat sink hybrid device 6 as shown in the previous drawings, but in more detail. Reference is also made to FIG. 5, in which there is shown an exploded view of the cold plate heat sink hybrid device 6 of FIG. 4 and which will be used to explain a possible structure and operation of this device. Where the same features as shown in previous drawings are depicted, identical reference numerals are used. The cold plate heat sink hybrid device 6 comprises: a base 27; an upper housing 22; a cold plate internal volume 23; and a receptacle part 15 (as discussed above). The base 27 and upper housing 22 define a closed cold plate internal volume 23 for receiving the secondary liquid coolant. The upper housing 22 also defines the receptacle part 15. The base 27 is adapted for mounting on an electronic device or component, for example by means of mounting holes 28 formed in the base 27. Upper pins 21 are provided in the receptacle part 15 and lower pins 26 are provided in the cold plate internal volume 23.

The interface between the cold plate internal volume 23 and the receptacle part 15 defines a heat transfer zone between the primary and secondary liquid coolants. The relatively cool (water-based) secondary liquid coolant cools the heat transfer zone and pins 21 in the receptacle part 15. This in turn cools the primary (dielectric) liquid coolant before it overflows into the server chassis 1. As the pump 13 is constantly circulating the hot primary liquid coolant through this circuit, all of the primary liquid coolant passes through the cold plate heat sink hybrid device 6, particularly its receptacle part 15 and is therefore actively cooled by the secondary (water-based) liquid coolant side of the system. By pumping the primary liquid coolant through this loop, such that all of the primary liquid coolant is cooled, no stagnant areas of the server chassis 1 (in which primary liquid coolant remains hot) result. The heat transfer performance of such an implementation is consequently high.

Moreover, cooling all of the primary liquid coolant in the cold plate heat sink hybrid device 6, rather than using a plate heat exchanger (for example, as described in International Patent Publication No. 2019/048864) means that the overall pressure drop in the primary liquid coolant loop is significantly less. This has a number of benefits: fewer pumps are required for this cooling loop, saving space; less pump power is required, saving energy; valuable space within the chassis 1 is not taken up with one or more plate heat exchangers; the area for cooling the primary liquid coolant is contained above the cold plate 6 and this can be kept within a 1U height, effectively giving the primary liquid coolant a zero footprint within the chassis 1.

Returning to the generalised sense discussed above, it may be considered that the side that is not substantially closed is approximately parallel to a surface of the body arranged for mounting on the electronic device.

In embodiments, the cold plate may further comprise: outer projections formed within the volume of the external receptacle so as to promote heat transfer between the primary and secondary liquid coolants. For example, the thermally conductive body may form a retaining wall that at least partially defines the volume of the external receptacle. Then, the outer projections are advantageously substantially the same size as a height of (and approximately parallel to) the retaining wall.

Additionally or alternatively, the cold plate may further comprise inner projections, formed within the internal volume of the thermally conductive body, in particular so as to promote heat transfer from the electronic device to the internal volume and/or heat transfer between the primary and secondary liquid coolants. In preferred embodiments, the inner projections extend substantially between (or the whole distance between) a surface of the internal volume distal the external receptacle to a surface of the internal volume proximate the external receptacle. This may provide improved heat transfer as well as increased structural integrity.

Optionally, the outer projections and/or inner projections comprise pins and/or fins.

In another generalised aspect, which may be combined with any other aspect described herein, there may be considered a system for cooling electronic devices, comprising: a sealable module (for instance, liquid-tight), housing the electronic devices and a primary liquid coolant, the system being configured such that the primary liquid coolant flows in operation (for example by convection and/or pumping); a cold plate as herein described and having an external receptacle for receiving primary liquid coolant (as well as being configured to receive secondary liquid coolant internally), mounted on (in particular, so as to receive heat from) at least one of the electronic devices; and a nozzle arrangement, arranged to direct the flowing primary liquid coolant into the volume of the external receptacle of the cold plate. The system is beneficially configured such that (all of) the primary liquid coolant is cooled by contact with the cold plate and specifically its external receptacle. Preferably, the system is configured such that all primary liquid coolant flows through the volume of the external receptacle of at least one cold plate in accordance with the present disclosure.

Advantageously, the primary liquid coolant flows from the nozzle arrangement into the volume of the external receptacle of the cold plate and flows out of (for example, by overflowing) the volume of the external receptacle of the cold plate so as to at least partially immerse other electronic devices housed in the sealable module. The other electronic devices typically have a lower temperature in operation than the temperature of the electronic device (or devices) cooled by the cold plate. In particular, a level of primary liquid coolant that is at least partially immersing other electronic devices housed in the sealable module is lower than a level of primary liquid coolant held in the volume of the external receptacle of the cold plate.

The system may further comprise: a module coolant inlet, for receiving the secondary liquid coolant from outside the sealable module; and an inlet piping arrangement, arranged to provide the secondary liquid coolant from the module coolant inlet to the coolant inlet of the cold plate. Additionally or alternatively, the system may further comprise a module coolant outlet, for providing the secondary liquid coolant to outside the module; and an outlet piping arrangement, arranged to provide the secondary liquid coolant from the coolant outlet of the cold plate to the module coolant outlet.

In embodiments, the system further comprises: an inlet manifold, coupled to the module coolant inlet and arranged to direct the secondary coolant from the module coolant inlet to the inlet piping arrangement. Additionally or alternatively, the system may further comprise an outlet manifold, coupled to the module coolant outlet and arranged to direct the secondary coolant from the outlet piping arrangement to the module coolant outlet.

The system preferably further comprises a pump arrangement, configured to cause the primary liquid coolant to flow within the sealable module to the nozzle arrangement of the cold plate. The pump arrangement may have one or more pumps, as will be discussed below. Convection may assist with the flow of primary liquid coolant and in some less preferred embodiments, the flow of primary liquid coolant may be entirely due to convection. In this case, piping and one or more nozzles are provided to direct the flow of coolant accordingly.

Multiple cold plates may be employed, each of which may be arranged to cool a respective one or more electronic devices in the module. For example, the cold plate described in general terms above may be considered a first cold plate. Then, the system may further comprise a second cold plate, mounted on (so as to receive heat from) at least one other of the electronic devices, the second cold plate having a coolant inlet and a coolant outlet. The second cold plate may be in accordance with any described herein or it may be a different, for example more conventional, cold plate.

In some embodiments, the inlet piping arrangement is further arranged to provide the secondary liquid coolant from the inlet manifold to the coolant inlet of the second cold plate. The outlet piping arrangement may be further arranged to provide the secondary liquid coolant from the coolant outlet of the second cold plate to the outlet manifold. In other words, the secondary liquid coolant loops of the first and second cold plates may be provided in parallel.

Alternatively, the secondary liquid coolant loops of the first and second cold plates may be provided in series. Then, the outlet piping arrangement is further arranged to provide the secondary liquid coolant from the coolant outlet of the first cold plate to the coolant inlet of the second cold plate and from the coolant outlet of the second cold plate to the module coolant outlet.

Where are second cold plate is used, the system may further comprise a pump manifold, configured to direct primary liquid coolant from the pump to the nozzle arrangement of the first cold plate and to the nozzle arrangement of the second cold plate. Additionally or alternatively, the pump arrangement may comprise multiple pumps, for example: a first pump, configured to direct primary liquid coolant to the nozzle arrangement of the first cold plate; and a second pump, configured to direct primary liquid coolant to the nozzle arrangement of the second cold plate.

In embodiments, the system may further comprise a heat exchanger, outside the sealable module, configured to receive the secondary liquid coolant from the sealable module and transfer heat from the secondary liquid coolant, for example to a fluid (which may be a liquid or gas). A heat rejection unit may be unit in some embodiments for this purpose.

Further details of specific embodiments will now be discussed. Generalised descriptions will also be provided at points below.

Figure 6:
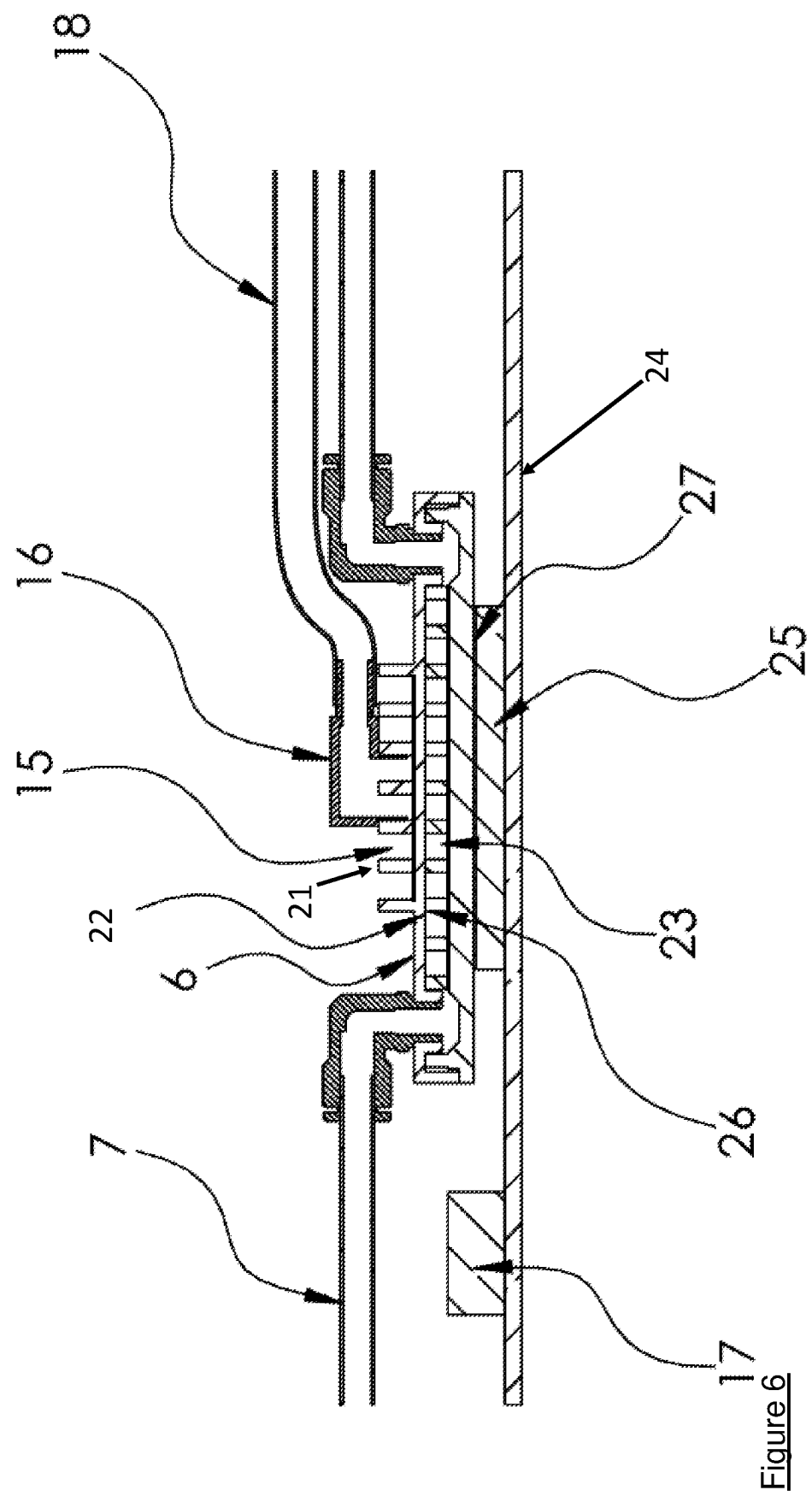
FIG. 6 illustrates a schematic cross-sectional view of a cold plate in accordance with an embodiment of the disclosure.

Referring now to FIG. 6, there is illustrated a schematic cross-sectional view of the cold plate heat sink hybrid device 6, as shown in previous drawings. The same features as previously shown are labelled with identical reference numerals. In this drawing, the cold plate heat sink hybrid device 6 is mounted on an electronic component 25 (such as an Integrated Circuit or IC). The electronic component 25 is mounted on a substrate 24, which may be a Printed Circuit Board (PCB) or even the base 12 of the chassis 1. Other, lower temperature components 17 mounted on the substrate 24 are also shown. Upper pins 21 in the receptacle part 15 and lower pins 26 in the cold plate internal volume 23 are both shown. The pins 26 within the cold plate internal volume 23 are full height, extending, making contact and bridging the gap between the base 27 (in contact with the electronic component 25) and the heat transfer zone defined at the upper housing 22. In other words, the pins 26 connect the base 27 to the upper housing (lid) 22 of the cold plate heat sink hybrid device 6. This provides great benefit to heat transfer between the primary and secondary liquid coolants, increasing the cooling performance. The full height pins 26 may also improve the strength of the components and remove the ability for coolant to shortcut around the pins 26.

Figure 7:
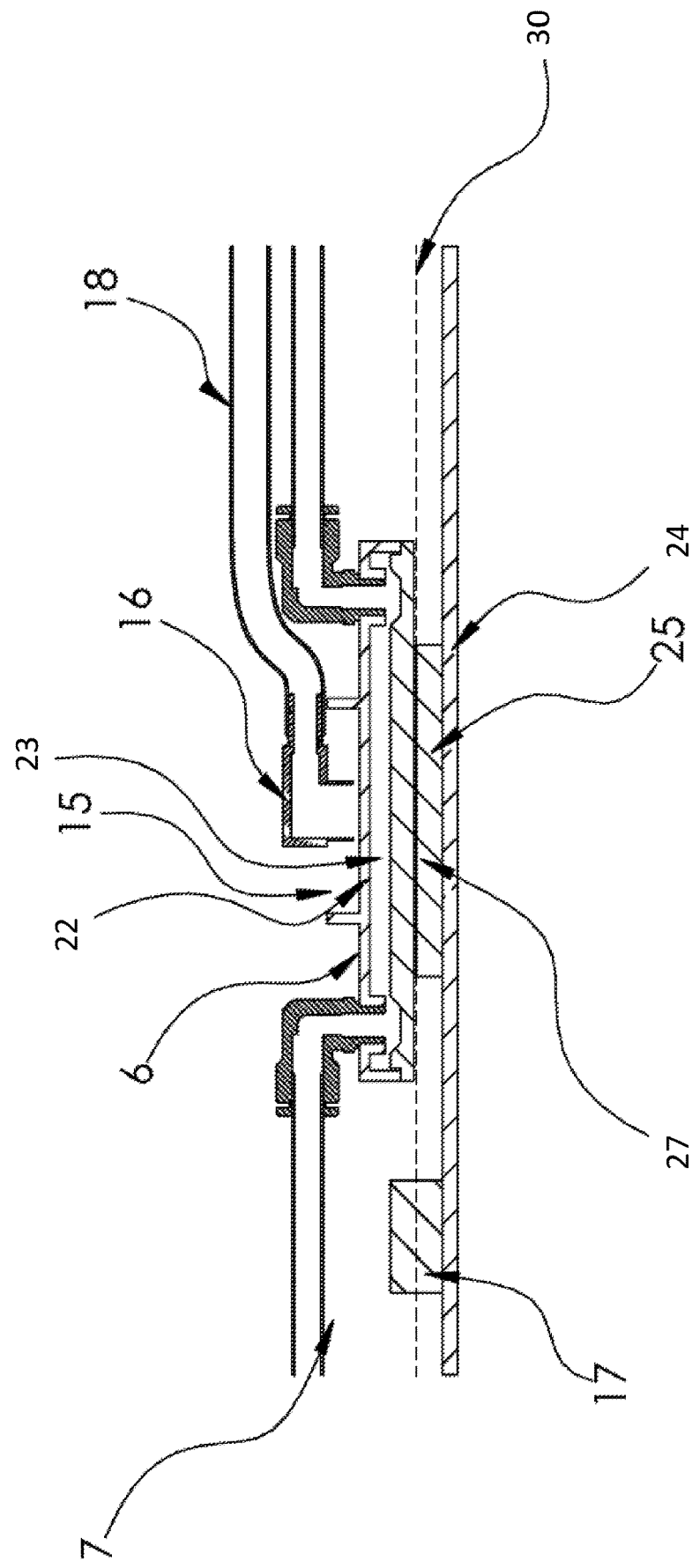
FIG. 7 illustrates a schematic cross-sectional view of a cold plate in accordance with a simplified or variant embodiment of the disclosure.

Referring now to FIG. 7, there is illustrated a schematic cross-sectional view of a simplified or variant of the cold plate heat sink hybrid device 6. This is essentially identical to that shown in FIG. 6, but without the upper pins 21 and lower pins 26. The omission of these pins allows further detail to be seen. In particular, the level 30 of primary liquid coolant in the chassis 1 is shown. In this example, the level 30 is sufficient to cover the electronic component 25 (which is anyway cooled by the cold plate 6) and to partially cover the lower temperature component 17. It can therefore be seen that the level 30 of primary liquid coolant in the chassis 1 is generally low and lower than the level of primary liquid coolant in the receptacle part 15 of the cold plate heat sink hybrid device 6 (which extends from the upper housing 22 to the height of the receptacle part 15).

Figure 8:
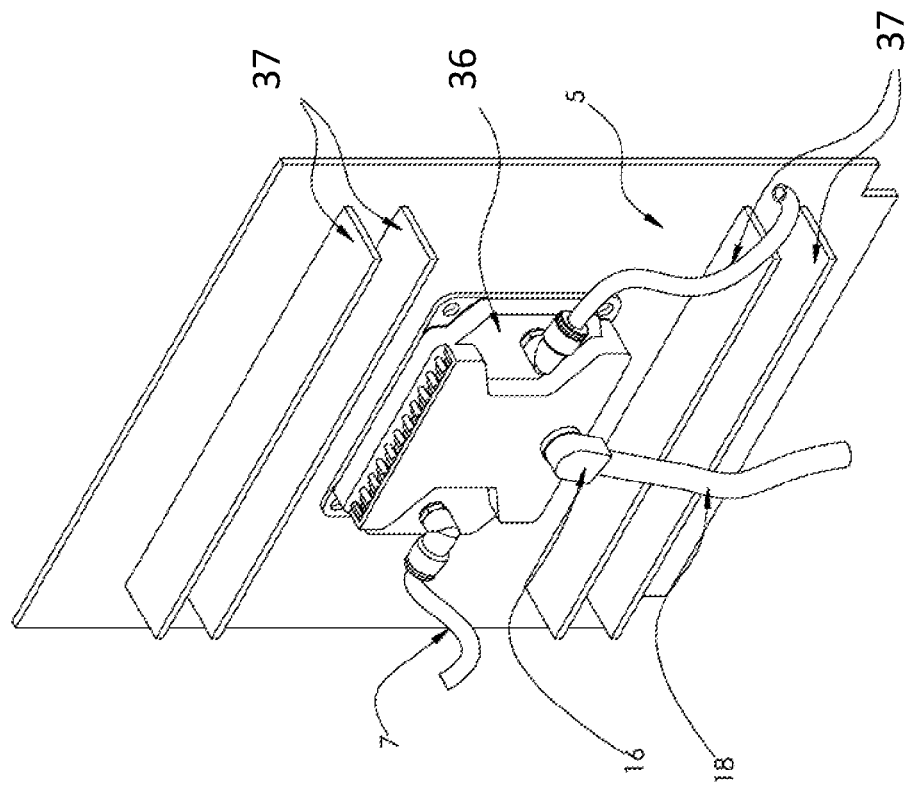
FIG. 8 depicts a schematic isolated isometric view of a portion of components within a server chassis in a yet further variant of that shown in FIG. 1.

As with the heat sinks described in International Patent Publication No. 2019/048864, the cold plate heat sink hybrid device of the present disclosure can be mounted either horizontally or vertically, to accommodate for hot components on different format PCBs or motherboards. With reference to FIG. 8, there is depicts a schematic isolated isometric view of a portion of components within a server chassis, in a yet further variant of that shown in FIG. 1, wherein the electronic component being cooled and the cold plate heat sink hybrid device cooling it are mounted vertically. Identical reference numerals label the same features as shown in other drawings. In this embodiment, a vertically-mounted cold plate heat sink hybrid device 36 is shown, together with a vertically-orientated PCB 5 on which other, low temperature components 37 are provided. This is substantially the same as the cold plate heat sink hybrid device 6 shown previously, but with a different configuration of its upper housing to define the receptacle part slightly differently. Whereas the receptacle part 15 cold plate heat sink hybrid device 6 shown previously has an open side opposite the cold plate internal volume, in this variant cold plate heat sink hybrid device 36, the open side of the receptacle part is adjacent the cold plate internal volume to allow coolant to be held in the receptacle part when the cold plate heat sink hybrid device 36 is mounted such that the open side is distal the base of the chassis. Also, the outlet nozzle 16 is positioned to direct primary liquid coolant into the volume of the receptacle part distal the open side. This allow promotes flow of primary coolant within the receptacle part from the bottom until overflowing at the open side.

In the general terms discussed above, it may be considered that, where the volume of the external receptacle is substantially closed on all but one side, the side that is not substantially closed may be perpendicular to a surface of the body arranged for mounting on the electronic device. In this case, where outer projections are provided and the thermally conductive body forms a retaining wall that at least partially defines the volume of the external receptacle, the outer projections may be advantageously approximately perpendicular to at least a part of the retaining wall.

Figure 9:
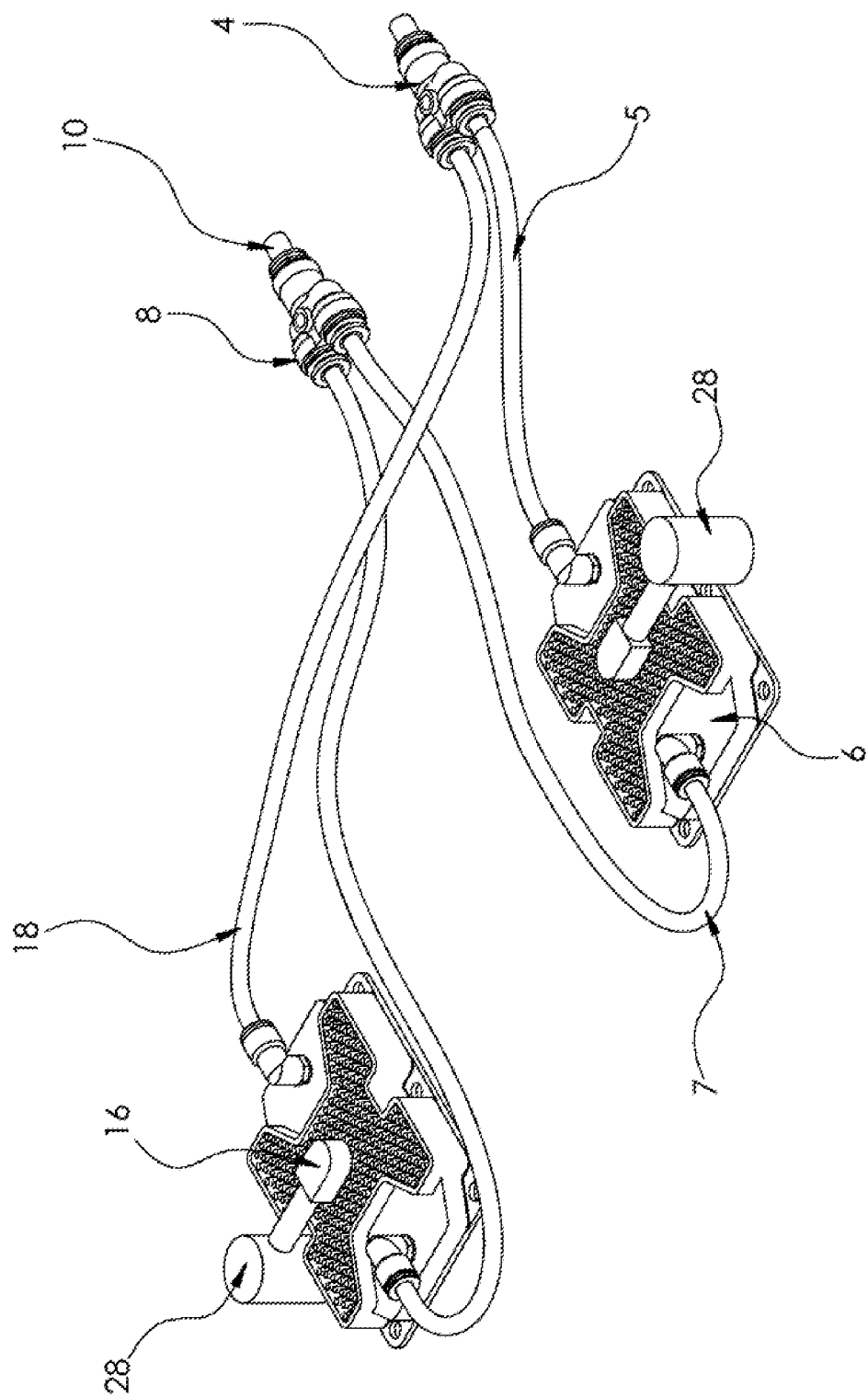
FIG. 9 shows a schematic isolated isometric view of a portion of multiple cold plates and further components within a server chassis in yet another variant of that shown in FIG. 1.

With reference to FIG. 9, there is shown a schematic isolated isometric view of a portion of multiple cold plates and further components within a server chassis in yet another variant. Again, the same features are labelled with identical reference numerals. In this variant, each cold plate heat sink hybrid device 6 has its own individual micro-pump 28. The micro-pumps 28 replace the need for a single, central pump 13, as shown in previous drawings. This has some benefits: lower pressure drop; reduced coolant level; reduced cost; partial redundancy (as the failure of a single micro-pump 28 need not prevent successful operation of the system); and micro-pumps 28 and cold plate heat sink hybrid device 6 could be installed as single subassembly. This variant may also be applied to vertically-mounted cold plate heat sink hybrid device 36, for example as shown in FIG. 8.

In the generalised sense discussed above, each pump of the pump arrangement may form part of (or be integrated with) a respective cold plate. For example, a first pump may form part of a first cold plate and wherein a second pump may form part of the second cold plate. For this purpose, the (or each) pump may be a micro-pump.

Although specific embodiments have now been described, the skilled person will appreciate that various modifications and alternations are possible. For example, the structure and/or design of the cold plate heat sink hybrid devices 6, 36 may vary from that shown. Other shapes and applications are possible. For instance, a stepped base (thermal interface) surface may be used (having multiple parallel planes), although a planar surface is preferred. Where pins are shown for increased cooling surface area and/or structural improvement, any combination of pins, fins or other projections may be used. Whilst a specific multi-part cold plate assembly is described, it is appreciated that the cold plate heat sink hybrid device may be implemented using other multi-part assemblies or as an integrally constructed device. Although the main flow of primary liquid coolant out of the receptacle part of the cold plate heat sink hybrid devices 6, 36 is described by overflowing, additionally or alternatively, holes may be provided in the receptacle part to allow primary liquid coolant to flow out to the remainder of the chassis internal volume. Multiple cold plates are shown in the drawings with their secondary liquid coolant loops in an advantageous parallel configuration, but a series configuration or a configuration that is a combination of series and parallel is possible.

All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A cold plate configured to use isolated primary and secondary liquid coolants, the cold plate comprising:
    a thermally conductive body defining an internal volume and arranged for mounting with respect to an electronic device, so as to transfer heat from the electronic device to the internal volume;
    a coolant inlet for receiving the secondary liquid coolant into the internal volume to receive the transferred heat; and
    a coolant outlet for the secondary liquid coolant to flow out of the internal volume; and
    wherein the thermally conductive body is further configured to define an external receptacle having a volume arranged to receive and retain the primary liquid coolant for heat transfer between the primary and secondary liquid coolants.

2. The cold plate of claim 1, wherein the volume of the external receptacle is closed on all but one side.

3. The cold plate of claim 2, wherein the side that is not closed is parallel or perpendicular to a surface of the body arranged for mounting on the electronic device.

4. The cold plate of claim 1, further comprising:
    outer projections formed within the volume of the external receptacle so as to promote heat transfer between the primary and secondary liquid coolants.

5. The cold plate of claim 4, wherein the thermally conductive body forms a retaining wall that at least partially defines the volume of the external receptacle and wherein the outer projections are the same size as a height of the retaining wall.

6. The cold plate of claim 1, further comprising:
    inner projections, formed within the internal volume of the thermally conductive body, so as to promote heat transfer from the electronic device to the internal volume and/or heat transfer between the primary and secondary liquid coolants.

7. The cold plate of claim 6, wherein the inner projections extend between a surface of the internal volume distal the external receptacle and a surface of the internal volume proximate the external receptacle.

8. A system for cooling electronic devices, comprising:
    a sealable module, housing the electronic devices and a primary liquid coolant, the system being configured such that the primary liquid coolant flows in operation;
    a cold plate, mounted on at least one electronic device of the electronic devices, wherein the cold plate is configured to use the primary liquid coolant isolated from a secondary liquid coolant, the cold plate comprising:
        a thermally conductive body defining an internal volume and arranged for mounting with respect to the at least one electronic device, so as to transfer heat from the at least one electronic device to the internal volume;
        a coolant inlet for receiving the secondary liquid coolant into the internal volume to receive the transferred heat; and
        a coolant outlet for the secondary liquid coolant to flow out of the internal volume; and
        wherein the thermally conductive body is further configured to define an external receptacle having a volume arranged to receive and retain the primary liquid coolant for heat transfer between the primary and secondary liquid coolants; and
    a nozzle arrangement, arranged to direct the flowing primary liquid coolant into the volume of the external receptacle of the cold plate.

9. The system of claim 8, further configured such that the primary liquid coolant flows from the nozzle arrangement into the volume of the external receptacle of the cold plate and flows out of the volume of the external receptacle of the cold plate so as to at least partially immerse other electronic devices housed in the sealable module.

10. The system of claim 9, configured such that a level of primary liquid coolant that is at least partially immersing other electronic devices housed in the sealable module is lower than a level of primary liquid coolant held in the volume of the external receptacle of the cold plate.

11. The system of claim 8, further comprising:
a module coolant inlet, for receiving the secondary liquid coolant from outside the sealable module;
a module coolant outlet, for providing the secondary liquid coolant to outside the module;
an inlet piping arrangement, arranged to provide the secondary liquid coolant from the module coolant inlet to the coolant inlet of the cold plate; and
an outlet piping arrangement, arranged to provide the secondary liquid coolant from the coolant outlet of the cold plate to the module coolant outlet.

12. The system of claim 11, further comprising:
an inlet manifold, coupled to the module coolant inlet and arranged to direct the secondary coolant from the module coolant inlet to the inlet piping arrangement; and
an outlet manifold, coupled to the module coolant outlet and arranged to direct the secondary coolant from the outlet piping arrangement to the module coolant outlet.

13. The system of claim 12, wherein the cold plate is a first cold plate, the system further comprising:
a second cold plate, mounted on at least one other electronic device of the electronic devices, the second cold plate having a coolant inlet and a coolant outlet; and
wherein the inlet piping arrangement is further arranged to provide the secondary liquid coolant from the inlet manifold to the coolant inlet of the second cold plate and wherein the outlet piping arrangement is further arranged to provide the secondary liquid coolant from the coolant outlet of the second cold plate to the outlet manifold.

14. The system of claim 13, wherein the second cold plate is configured to use the primary liquid coolant isolated from a secondary liquid coolant, the second cold plate comprising:
a second thermally conductive body defining a second internal volume and arranged for mounting with respect to the at least one other electronic device, so as to transfer heat from the at least one other electronic device to the second internal volume;
a second coolant inlet for receiving the secondary liquid coolant into the second internal volume to receive the transferred heat; and
a second coolant outlet for the secondary liquid coolant to flow out of the second internal volume; and
wherein the second thermally conductive body is further configured to define a second external receptacle having a volume arranged to receive and retain the primary liquid coolant for heat transfer between the primary and secondary liquid coolants.

15. The system of claim 11, wherein the cold plate is a first cold plate, the system further comprising:
a second cold plate, mounted on at least one other of the electronic devices, the second cold plate having a coolant inlet and a coolant outlet; and
wherein the outlet piping arrangement is further arranged to provide the secondary liquid coolant from the coolant outlet of the first cold plate to the coolant inlet of the second cold plate and from the coolant outlet of the second cold plate to the module coolant outlet.

16. The system of claim 15, wherein the second cold plate is configured to use the primary liquid coolant isolated from a secondary liquid coolant, the second cold plate comprising:
a second thermally conductive body defining a second internal volume and arranged for mounting with respect to at least one other electronic device, so as to transfer heat from the at least one other electronic device to the second internal volume;
a second coolant inlet for receiving the secondary liquid coolant into the second internal volume to receive the transferred heat; and
a second coolant outlet for the secondary liquid coolant to flow out of the second internal volume; and
wherein the second thermally conductive body is further configured to define a second external receptacle having a volume arranged to receive and retain the primary liquid coolant for heat transfer between the primary and secondary liquid coolants.

17. The system of claim 8, further comprising:
a pump arrangement, configured to cause the primary liquid coolant to flow within the sealable module to the nozzle arrangement of the cold plate.

18. The system of claim 17, wherein the cold plate is a first cold plate, the system further comprising:
a second cold plate configured to use the primary liquid coolant isolated from a secondary liquid coolant, the second cold plate comprising:
a second thermally conductive body defining a second internal volume and arranged for mounting with respect to at least one other electronic device, so as to transfer heat from the at least one other electronic device to the second internal volume;
a second coolant inlet for receiving the secondary liquid coolant into the second internal volume to receive the transferred heat; and
a second coolant outlet for the secondary liquid coolant to flow out of the second internal volume; and
wherein the second thermally conductive body is further configured to define a second external receptacle having a volume arranged to receive and retain the primary liquid coolant for heat transfer between the primary and secondary liquid coolants;
a second nozzle arrangement, arranged to direct the flowing primary liquid coolant into the volume of the second external receptacle of the second cold plate; and
a pump manifold, configured to direct primary liquid coolant from the pump to the nozzle arrangement of the first cold plate and to the second nozzle arrangement.

19. The system of claim 17, wherein the cold plate is a first cold plate, the system further comprising:
a second cold plate configured to use the primary liquid coolant isolated from a secondary liquid coolant, the second cold plate comprising:
a second thermally conductive body defining a second internal volume and arranged for mounting with respect to at least one other electronic device, so as to transfer heat from the at least one other electronic device to the second internal volume;
a second coolant inlet for receiving the secondary liquid coolant into the second internal volume to receive the transferred heat; and a second coolant outlet for the secondary liquid coolant to flow out of the second internal volume; and wherein the second thermally conductive body is further configured to define a second external receptacle having a volume arranged to receive and retain the primary liquid coolant for heat transfer between the primary and secondary liquid coolants;

a second nozzle arrangement, arranged to direct the flowing primary liquid coolant into the volume of the second external receptacle of the second cold plate; and wherein the pump arrangement comprises: a first pump, configured to direct primary liquid coolant to the nozzle arrangement of the first cold plate; and a second pump, configured to direct primary liquid coolant to the second nozzle arrangement.

20. The system of claim 19, wherein the first pump forms part of the first cold plate and wherein the second pump forms part of the second cold plate.

* * * * *